US012658562B2

(12) United States Patent
Chou et al.

(10) Patent No.: US 12,658,562 B2
(45) Date of Patent: Jun. 16, 2026

(54) HOLLOW ANTENNA SUBSTRATE AND ITS MANUFACTURING METHOD FOR ANTENNA PACKAGING APPLICATIONS

(71) Applicant: Phoenix Pioneer Technology Co., Ltd., Hsinchu County (TW)

(72) Inventors: Pao-Hung Chou, Hsinchu County (TW); Ming-Yeh Chang, Hsinchu County (TW); Shih-Ping Hsu, Hsinchu County (TW)

(73) Assignee: Phoenix Pioneer Technology Co., Ltd., Hsinchu County (TW)

( * ) Notice: Subject to any disclaimer, the term of this patent is extended or adjusted under 35 U.S.C. 154(b) by 84 days.

(21) Appl. No.: 18/963,334

(22) Filed: Nov. 27, 2024

(65) Prior Publication Data

US 2025/0174874 A1 May 29, 2025

(30) Foreign Application Priority Data

Nov. 29, 2023 (TW) ................................. 112146257

(51) Int. Cl.
*H01Q 1/22* (2006.01)
*H01Q 9/04* (2006.01)
*H10W 70/685* (2026.01)

(52) U.S. Cl.
CPC ......... *H01Q 1/2283* (2013.01); *H01Q 9/0414* (2013.01); *H10W 70/685* (2026.01)

(58) Field of Classification Search
CPC .. H01Q 1/2283; H01Q 9/0414; H10W 70/685
See application file for complete search history.

(56) References Cited

U.S. PATENT DOCUMENTS 10,833,394 B2 * 11/2020 Tsai ..................... H01Q 1/2283
11,973,017 B2 * 4/2024 Williamson ........ H10W 70/685
2022/0013889 A1 * 1/2022 Choi ..................... H01Q 1/2283

FOREIGN PATENT DOCUMENTS

CN       111415921 B  * 6/2021  ............ H10W 74/10
WO    WO-2023234695 A1 * 12/2023  ........... H01Q 9/0407

* cited by examiner

*Primary Examiner* — Seung H Lee

(57) ABSTRACT

A hollow antenna substrate includes at least three layers of substrate structure. The first layer of the substrate has a first patterned metal layer and a first dielectric layer, with the first patterned metal layer embedded within the first dielectric layer, and a first upper surface and a first lower surface of the first patterned metal layer exposed to the first dielectric layer. The second layer is stacked on the first layer and has a second dielectric layer with a second patterned opening formed therein. The third layer is stacked on the second layer and has a third patterned metal layer and a third dielectric layer, with the third patterned layer embedded in the third dielectric layer and a third upper surface and a third lower surface exposed. The second patterned opening forms a hollow structure. A manufacturing method for the hollow antenna substrate is also provided.

10 Claims, 14 Drawing Sheets

331

321

322

39

331

332

322

39

3311

331

332

39

334

3311

331

332

39

451
495
FIG. 9A
451
452
495
FIG. 9B
4511
451
452
495
FIG. 9C
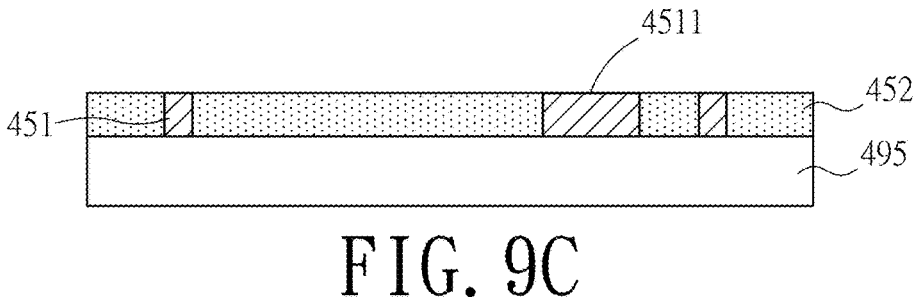
4511          454
451
452
495
4512
FIG. 9D
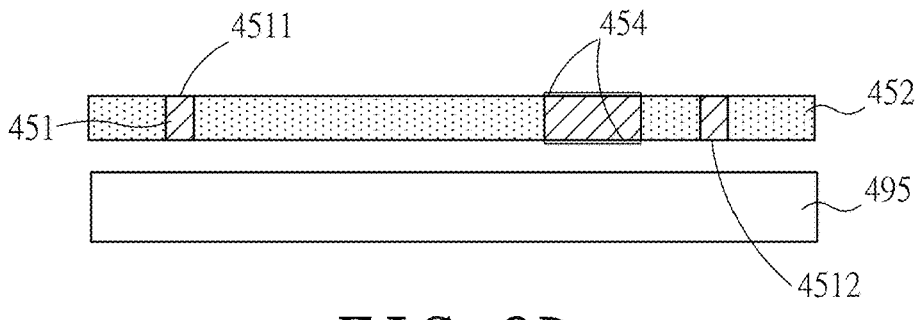
453          454
451
452
FIG. 9E

HOLLOW ANTENNA SUBSTRATE AND ITS MANUFACTURING METHOD FOR ANTENNA PACKAGING APPLICATIONS

CROSS-REFERENCE TO RELATED APPLICATION

This application claims the priority benefit of Taiwan application (No. 112146257), filed on Nov. 29, 2023. The entirety of the above-mentioned patent application is hereby incorporated by reference herein and made a part of this specification.

FIELD OF THE INVENTION

The invention relates to an antenna structure and a manufacturing method thereof, and more particularly to a hollow antenna substrate for high-frequency antenna package applications and a manufacturing method thereof.

BACKGROUND OF THE INVENTION

Antenna-in-Package (AiP) integrates an RF chip (transceiver) and an antenna into a single package. Its main advantages include shorter interconnection between the antenna and the RF chip, lower difficulty in system design, smaller overall size, and better electrical properties than traditional separate antenna devices.

As shown in FIG. 1, in an existing antenna package 90, an upper substrate 92 is arranged on a lower substrate 91, and an upper surface 911 of the lower substrate 91 and an upper surface 921 of the upper substrate 92 are respectively provided with a first metal layer 93 and a second metal layer 94. In the design of the antenna, both the upper substrate 91 and the lower substrate 92 need to be made of expensive high-frequency dielectric materials. However, the high-frequency dielectric materials all have a dielectric constant (Dk) of greater than "1" and a loss factor (Df) of greater than "0", so there will be signal loss in the antenna. Therefore, it is difficult to achieve the best performance of the antenna, and the higher the frequency of the dielectric material, the higher the cost.

Besides, as shown in FIG. 2, in another existing antenna package 80, a first metal layer 82 is arranged on an upper surface 811 of a lower substrate 81, a second metal layer 84 is arranged on an upper surface 831 of an upper substrate 83, and the lower substrate 81 and the upper substrate 83 are bound through solder balls 85. The solder balls 85 can allow the formation of an air gap between the lower substrate 81 and the upper substrate 83. In this structure, although the best effect of the loss factor "0" can be obtained by using air as the air dielectric layer, there is still a part of the upper substrate 83 between the first metal layer 82 and the second metal layer 84 in addition to the air dielectric layer, so the loss factor can only be partially improved. In addition, since the second metal layer 84 is arranged on the upper substrate 83, the upper substrate 83 still needs to be made of the expensive high-frequency dielectric material. Moreover, the height of the air gap depends on the height of the solder ball 85, so it is prone to positional offsets during processing, thereby lowering the performance of the antenna. Besides, only one layer of antenna can be made in this antenna package. If the number of layers is to be increased, the antenna package must be layer by layer, which leads to the disadvantages of complicated assembly process, high cost, large space occupation and signal interference.

Therefore, it is one of the significant issues at present on how to provide a hollow antenna substrate for antenna package applications and a manufacturing method thereof such that it is easy to design an antenna with better performance without influence on quality by process factors.

SUMMARY OF THE INVENTION

In view of the above, an objective of the invention is to provide a hollow antenna substrate for antenna package applications and a manufacturing method thereof. Semiconductor technology may be used to make the hollow antenna substrate so as to improve the process and product accuracy. The hollow antenna substrate may be connected with a ready-made package carrier to form an antenna-containing antenna package, thereby simplifying the process and reducing the cost.

In order to achieve the above objective, the manufacturing method of a hollow antenna substrate of the invention includes steps as follows. (A) A carrier plate is provided. (B) A patterned metal layer is arranged on the carrier plate. (C) A dielectric layer is arranged on the carrier plate to cover the patterned metal layer, and an upper surface of the patterned metal layer is exposed. (D) A patterned protective layer is arranged on a part of the upper surface of the patterned metal layer to form a substrate semi-finished product. (E) Step (B) to step (D) are repeated a plurality of times, where the carrier plate in step (B) is replaced with the substrate semi-finished product formed in the previous step (D), and a multi-layer stacked substrate semi-finished product is formed. (F) The carrier plate is removed. (G) A part of surfaces of the patterned metal layers on two outer sides of the multi-layer stacked substrate semi-finished product are covered with a patterned protective layer. (H) A metal material of the part of the patterned metal layer that is not covered and protected by the patterned protective layer is removed to form the hollow antenna substrate with a hollow structure.

In addition, in order to achieve the above objective, another manufacturing method of a hollow antenna substrate of the invention includes steps as follows. (A) A carrier plate is provided. (B) A patterned metal layer is arranged on the carrier plate, the patterned metal layer having an upper surface and a corresponding lower surface. (C) A dielectric layer is arranged on the carrier plate to cover the patterned metal layer, and the upper surface of the patterned metal layer is exposed. (D) The carrier plate is removed, and the lower surface of the patterned metal layer is exposed. (E) A patterned protective layer is formed on a part of the upper surface and a part of the lower surface of the patterned metal layer. (F) A metal material of the patterned metal layer that is not covered by the patterned protective layer is removed to form a semi-finished product having an opening. (G) Step A to step F are repeated a plurality of times to form a plurality of semi-finished products. (H) The plurality of semi-finished products are stacked and bound to form the hollow antenna substrate with a hollow structure.

Further, the plurality of semi-finished products are connected with each other through a thinner adhesive.

Furthermore, in order to achieve the above objective, the invention further provides a hollow antenna substrate, including a first layer of the substrate, a second layer of the substrate and a third layer of the substrate that are stacked. The first layer of the substrate has a first patterned metal layer and a first dielectric layer. The first patterned metal layer is embedded in the first dielectric layer. A first upper surface and a first lower surface of the first patterned metal layer are exposed to an upper surface and a lower surface of the first dielectric layer. The first dielectric layer has a first patterned opening running through the upper surface and the lower surface of the first dielectric layer. The second layer of the substrate is stacked on the first layer of the substrate and has a second patterned metal layer and a second dielectric layer. The second patterned metal layer is embedded in the second dielectric layer. A second upper surface and a second lower surface of the second patterned metal layer are exposed to an upper surface and a lower surface of the second dielectric layer. The second dielectric layer has a second patterned opening running through the upper surface and the lower surface of the second dielectric layer. The third layer of the substrate is stacked on the second layer of the substrate and has a third patterned metal layer and a third dielectric layer. The third patterned metal layer is embedded in the third dielectric layer. A third upper surface and a third lower surface of the third patterned metal layer are exposed to an upper surface and a lower surface of the third dielectric layer. The third dielectric layer has a third patterned opening running through the upper surface and the lower surface of the third dielectric layer. In the above hollow antenna substrate, the first patterned opening, the second patterned opening and the third patterned opening are in communication with each other to form a hollow structure.

Further, the first upper surface and the first lower surface of the first patterned metal layer, and the third upper surface and the third lower surface of the third patterned metal layer are each provided with a patterned protective layer.

Further, an overlapping part of the first patterned metal layer and the third patterned metal layer form an antenna unit, and the first patterned metal layer and the third patterned metal layer are spaced apart by the second patterned opening.

Further, the first dielectric layer of the first layer of the substrate has the first patterned opening running through an upper surface and a lower surface of the first layer of the substrate. The third dielectric layer of the third layer of the substrate has the third patterned opening running through the upper surface and the lower surface of the third dielectric layer. The second layer of the substrate further has a second patterned metal layer. The second patterned metal layer is embedded in the second dielectric layer. A second upper surface and a second lower surface of the second patterned metal layer are exposed to an upper surface and a lower surface of the second dielectric layer.

Further, the hollow antenna substrate further includes: a fourth layer of the substrate, stacked on the third layer of the substrate and having a fourth dielectric layer. The fourth dielectric layer has a fourth patterned opening running through an upper surface and a lower surface of the fourth dielectric layer.

Further, the hollow antenna substrate further includes: a fifth layer of the substrate, stacked on the fourth layer of the substrate and having a fifth patterned metal layer and a fifth dielectric layer. The fifth patterned metal layer is embedded in the fifth dielectric layer. A fifth upper surface and a fifth lower surface of the fifth patterned metal layer are exposed to an upper surface and a lower surface of the fifth dielectric layer. The fifth dielectric layer has a fifth patterned opening running through the upper surface and the lower surface of the fifth dielectric layer.

Further, an overlapping part of the first patterned metal layer and the fifth patterned metal layer forms an antenna unit, and the first patterned metal layer and the fifth patterned metal layer are spaced apart by the second patterned opening, the third patterned opening and the fourth patterned opening.

4

Further, the fifth upper surface and the fifth lower surface of the fifth patterned metal layer are each provided with a patterned protective layer.

Based on the above, according to the hollow antenna substrate and the manufacturing method thereof in the invention, the antenna is formed in a semiconductor package structure. Besides, since the air in the hollow structure has a dielectric constant (Dk) of "1" and a loss factor (Df) of "0", it is easy to design an antenna with excellent electrical properties and high performance. Moreover, the formed hollow antenna substrate can be easily bound to the semiconductor package carrier, which can simplify the process of an antenna-containing package carrier. Besides, according to the hollow antenna substrate and the manufacturing method thereof in the invention, it is easy to make a multi-layer hollow antenna.

BRIEF DESCRIPTION OF THE DRAWINGS

The invention will be further described in detail below in conjunction with the accompanying drawings and specific implementations.

FIG. 9A to FIG. 9E are schematic structural views corresponding to a manufacturing process of a fifth semi-finished product in the manufacturing method of a hollow antenna substrate according to the second embodiment of the invention.

DETAILED DESCRIPTION OF PREFERRED EMBODIMENTS

In order to make those skilled in the art understand the contents of the invention and realize the contents of the invention accordingly, the following description is made with reference to preferred embodiments and accompanying drawings.

Figure 1:
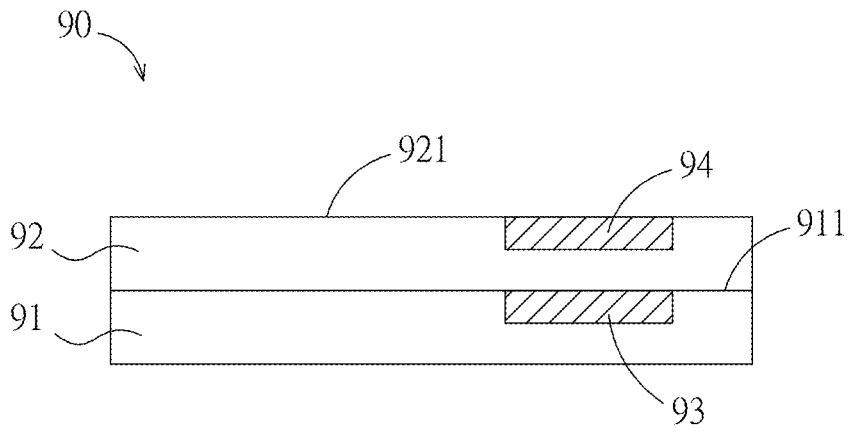
FIG. 1 is a schematic view of an existing antenna package.
Figure 2:
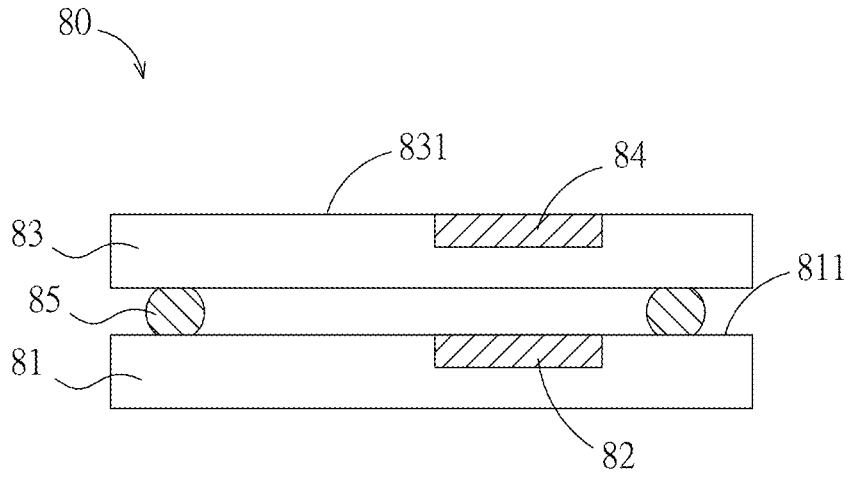
FIG. 2 is a schematic view of another existing antenna package.
Figure 3:
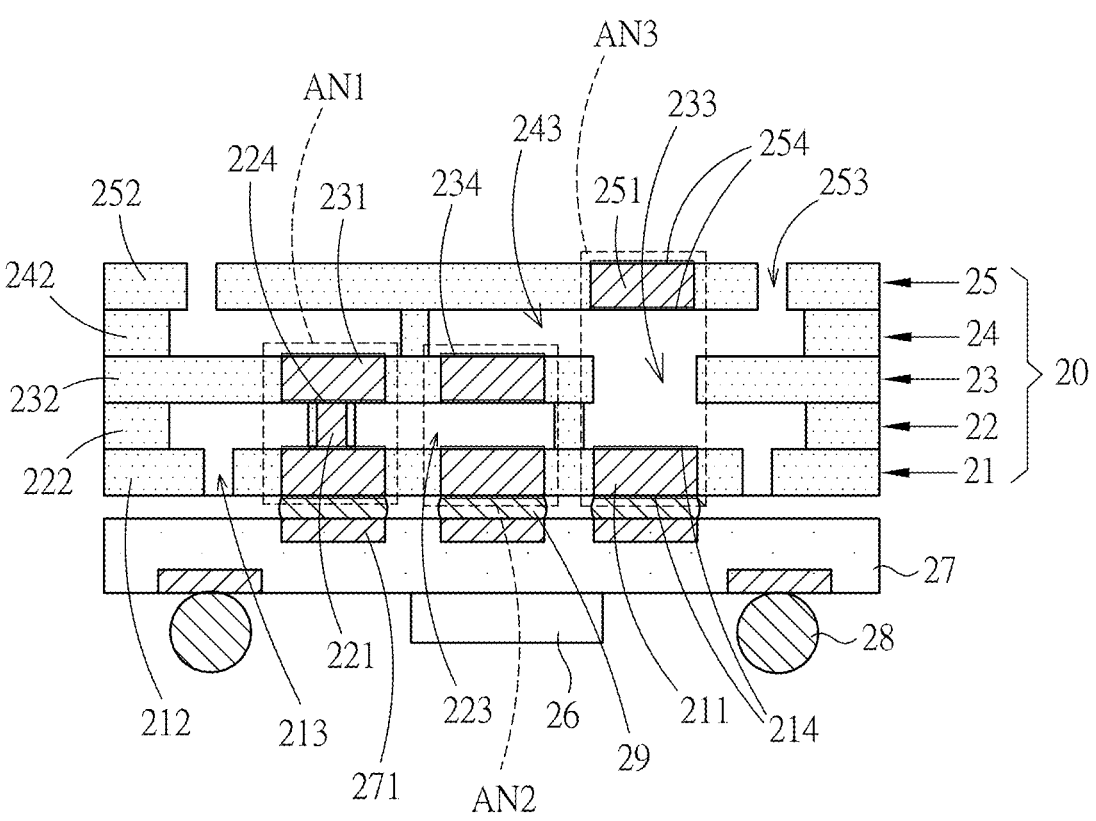
FIG. 3 is a schematic sectional view of an antenna package including a hollow antenna substrate according to a preferred embodiment of the invention.

Referring to FIG. 3, a hollow antenna substrate 20 in a preferred embodiment of the invention includes a first layer of the substrate 21, a second layer of the substrate 22, a third layer of the substrate 23, a fourth layer of the substrate 24 and a fifth layer of the substrate 25 that are stacked.

The first layer of the substrate 21 has a first patterned metal layer 211, a first dielectric layer 212, a first patterned opening 213 and a first patterned protective layer 214. The first patterned metal layer 211 is embedded in the first dielectric layer 212, and a first upper surface and a first lower surface of the first patterned metal layer 211 are respectively exposed to an upper surface and a lower surface of the first dielectric layer 212. Besides, a part of an upper surface and a part of a lower surface of the first layer of the substrate 21 are further covered with the first patterned protective layer 214. In addition, the first patterned opening 213 is arranged in the first dielectric layer 212, and may be arranged at a distance from the first patterned metal layer 211.

The second layer of the substrate 22 is stacked on the first layer of the substrate 21, and has a second patterned metal layer 221, a second dielectric layer 222, a second patterned opening 223 and a second patterned protective layer 224. The second patterned metal layer 221 is embedded in the second dielectric layer 222, and a second upper surface and a second lower surface of the second patterned metal layer 221 are respectively exposed to an upper surface and a lower surface of the second dielectric layer 222. Besides, a part of an upper surface and a part of a lower surface of the second layer of the substrate 22 are further covered with the second patterned protective layer 224. In addition, the second patterned opening 223 is arranged in the second dielectric layer 222, may be arranged at a distance from the second patterned metal layer 221, and is in communication with the first patterned opening 213.

The third layer of the substrate 23 is stacked on the second layer of the substrate 22, and has a third patterned metal layer 231, a third dielectric layer 232, a third patterned opening 233 and a third patterned protective layer 234. The third patterned metal layer 231 is embedded in the third dielectric layer 232, and a third upper surface and a third lower surface of the third patterned metal layer 231 are respectively exposed to an upper surface and a lower surface of the third dielectric material 232. Besides, a part of an upper surface and a part of a lower surface of the third layer of the substrate 23 are further covered with the third patterned protective layer 234. In addition, the third patterned opening 233 is arranged in the third dielectric layer 232, may be arranged at a distance from the third patterned metal layer 231, and is in communication with the second patterned opening 223. A part of the third patterned metal layer 231 and a part of the first patterned metal layer 211 may be electrically coupled to form an antenna structure. For example, as shown in FIG. 3, the hollow antenna substrate 20 has a first antenna AN1 and a second antenna AN2 therein.

The fourth layer of the substrate 24 is stacked on the third layer of the substrate 23, and has a fourth dielectric layer 242 and a fourth patterned opening 243. The fourth patterned opening 243 is arranged in the fourth dielectric layer 242, that is, the fourth layer of the substrate 24 is provided with the fourth patterned opening 243 only in the fourth dielectric layer 242, and the fourth patterned opening 243 is in communication with the third patterned opening 233.

The fifth layer of the substrate 25 is stacked on the fourth layer of the substrate 24, and has a fifth patterned metal layer 251, a fifth dielectric layer 252, a fifth patterned opening 253 and a fifth patterned protective layer 254. The fifth patterned metal layer 251 is embedded in the fifth dielectric layer 252, and a fifth upper surface and a fifth lower surface of the fifth patterned metal layer 251 are respectively exposed to an upper surface and a lower surface of the fifth dielectric material 252. Besides, a part of an upper surface and a part of a lower surface of the fifth layer of the substrate 25 are further covered with the fifth patterned protective layer 254. In addition, the fifth patterned opening 253 is arranged in the fifth dielectric layer 252, may be arranged at a distance from the fifth patterned metal layer 251, and is in communication with the fourth patterned opening 243. A part of the fifth patterned metal layer 251 and a part of the first patterned metal layer 211 may be electrically coupled to form an antenna structure. For example, as shown in FIG. 3, the hollow antenna substrate 20 has a third antenna AN3 therein.

It is worth mentioning that the first patterned opening 213, the second patterned opening 223, the third patterned opening 233, the fourth patterned opening 243 and the fifth patterned opening 253 that are stacked form a hollow structure. Since upper and lower sides of the first patterned metal layer 211, the second patterned metal layer 221, the third patterned metal layer 231, the fourth patterned metal layer 241 and the fifth patterned metal layer 251 are all hollow without the barrier of the dielectric layers and the loss factor of air is "0", by combining the hollow structure with the first patterned metal layer 211, the second patterned metal layer 221, the third patterned metal layer 231, the fourth patterned metal layer 241 and the fifth patterned metal layer 251, it is easy to design a high-efficiency antenna. In this embodiment, as shown in FIG. 3, the hollow antenna substrate 20 has a first antenna AN1, a second antenna AN2 and a third antenna AN3 therein.

Besides, in this embodiment, a material of the first patterned metal layer 211, the second patterned metal layer 221, the third patterned metal layer 231, the fourth patterned metal layer 241 and the fifth patterned metal layer 251 is, for example, copper, which may be in the shape of a sheet, a block, a column or the like. A material of the first dielectric layer 212, the second dielectric layer 222, the third dielectric layer 232, the fourth dielectric layer 242 and the fifth dielectric layer 252 includes, for example, but not limited to, epoxy resin (prepreg, ABF) or a molding compound. A material of the first patterned protective layer 214, the second patterned protective layer 224, the third patterned protective layer 234, the fourth patterned protective layer 244 and the fifth patterned protective layer 254 includes, but not limited to, nickel, gold and a combination or alloy thereof, and the materials selected for each layer may be the same or different, depending on the design requirements.

In addition, the part of the upper surface of each layer of the substrate mentioned above is not limited to the surface of a physical element. Since the opening also belongs to a part of the substrate, the surface may also be located at the opening.

Referring to FIG. 3, the hollow antenna substrate 20 can be conveniently integrated with a chip 26 to form an antenna package. For example, the hollow antenna substrate 20 and the chip 26 may be respectively arranged on an upper surface and a lower surface of a package carrier 27. The hollow antenna substrate 20 is arranged on the upper surface of the package carrier 27, and the chip 26 is arranged on the lower surface of the package carrier 27. The upper surface and the lower surface of the package carrier 27 may be respectively provided with electrical connection pads 271. The electrical connection pads 271 located on the upper surface are connected with the hollow antenna substrate 20 through a conductive connection element 29, and the electrical connection pads 271 located on the lower surface may be connected with other electronic devices through conductive bumps 28. Besides, the hollow antenna substrate 20 and the chip 26 may be bonded to the lower surface of the package carrier 27 by any bonding technology, such as welding, conductive bumps or conductive adhesives.

Next, two embodiments will be provided to illustrate a manufacturing method of a hollow antenna substrate. First, referring to FIG. 4A to FIG. 4U, the manufacturing method of a hollow antenna substrate according to a first embodiment includes step S01 to step S22.

Figure 4A:
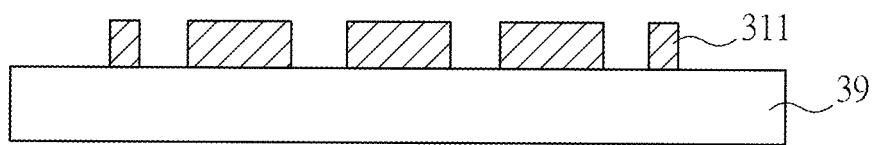
FIG. 4A to FIG. 4U are schematic structural views corresponding to a process of a manufacturing method of a hollow antenna substrate according to a first embodiment of the invention.

As shown in FIG. 4A, in step S01, a carrier plate 39 is provided. In step S02, a first patterned metal layer 311 is formed on the carrier plate 39. A material of the first patterned metal layer 311 is, for example, copper, and the first patterned metal layer is formed on the carrier plate 39 by photolithography and electroplating.

Figure 4B:
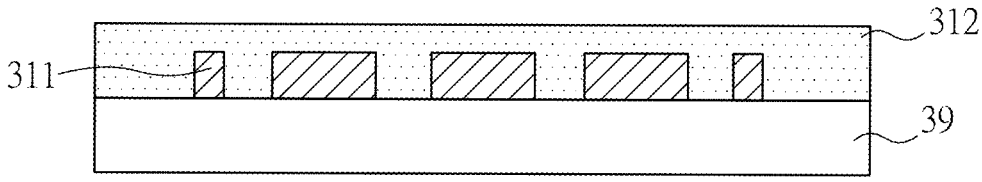

As shown in FIG. 4B, in step S03, a first dielectric layer 312 is formed on the carrier plate 39 to cover the first patterned metal layer 311. The first dielectric layer 312 is formed by molding and covers the first patterned metal layer 311.

Figure 4C:
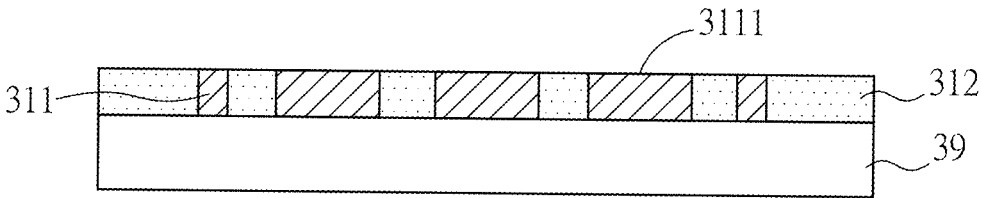

As shown in FIG. 4C, in step S04, a surface of the first dielectric layer 312 is polished to expose a first upper surface 3111 of the first patterned metal layer 311.

Figure 4D:
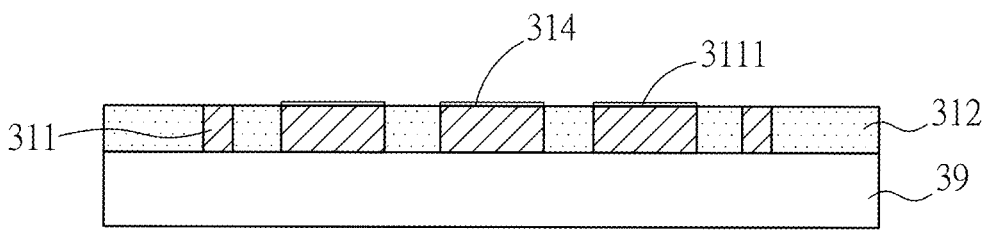

As shown in FIG. 4D, in step S05, a first patterned protective layer 314 is formed on a part of the first upper surface 3111 of the first patterned metal layer 311 exposed to the first dielectric layer 312. In this embodiment, the first patterned protective layer 314 is, for example, a nickel-gold layer, which may be formed on a part of the first upper surface 3111 of the first patterned metal layer 311 by photolithography and electroplating. After the manufacturing method of a hollow antenna substrate proceeds to this step, a first semi-finished product is formed.

Figure 4E:
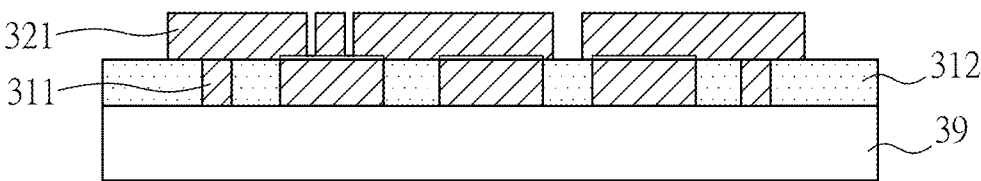
Figure 4F:
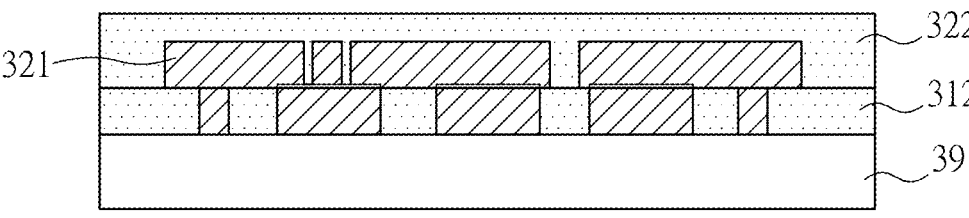
Figure 4G:
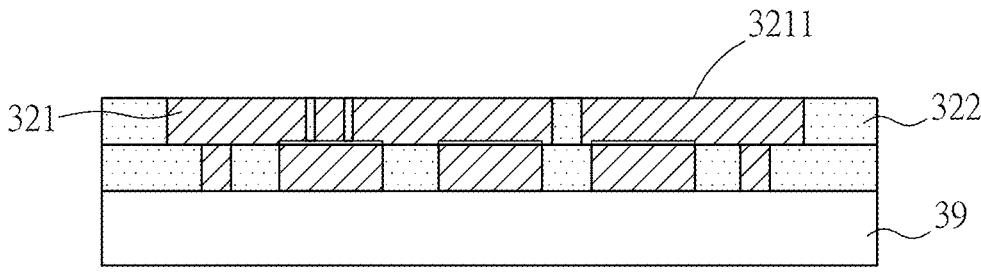
Figure 4H:
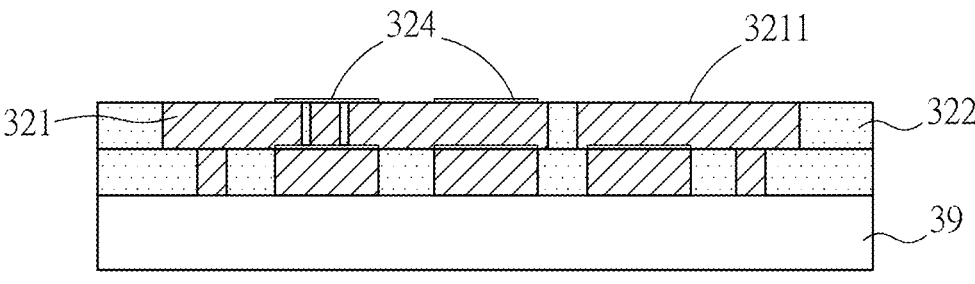

As shown in FIG. 4E, in step S06, a second patterned metal layer 321 is formed on the first semi-finished product by photolithography and electroplating. As shown in FIG. 4F, in step S07, a second dielectric layer 322 is formed on the first semi-finished product by molding to cover the second patterned metal layer 321. As shown in FIG. 4G, in step S08, a surface of the second dielectric layer 322 is polished to expose a second upper surface 3211 of the second patterned metal layer 321. As shown in FIG. 4H, in step S09, a second patterned protective layer 324 may be formed on a part of the second upper surface 3211 of the second patterned metal layer 321 exposed to the second dielectric layer 322 by photolithography and electroplating. After the manufacturing method of a hollow antenna substrate proceeds to this step, a second semi-finished product is formed.

Figure 4I:
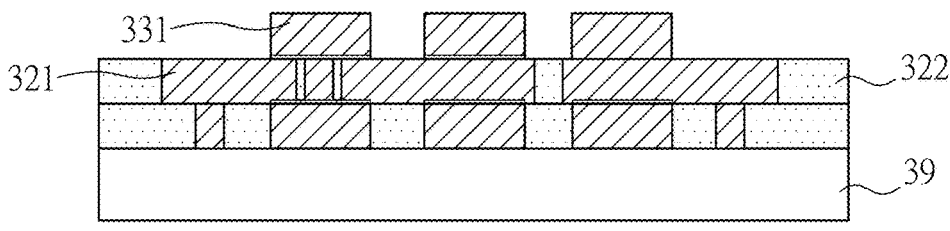
Figure 4J:
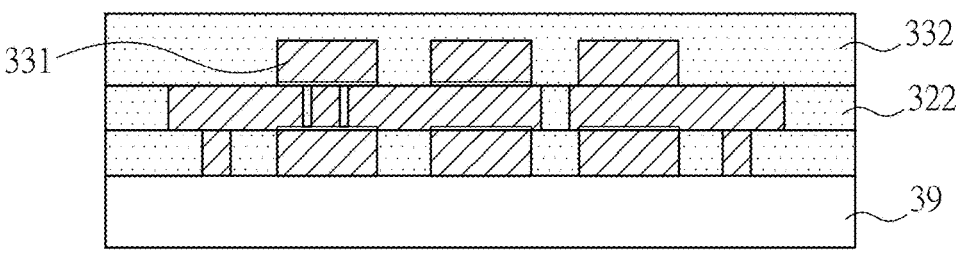
Figure 4K:
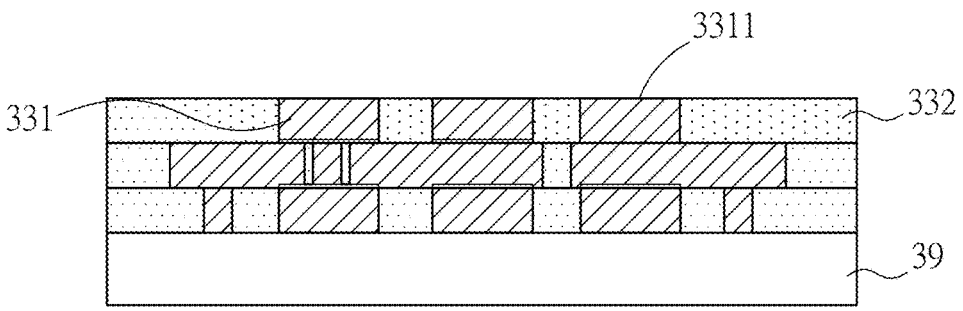
Figure 4L:
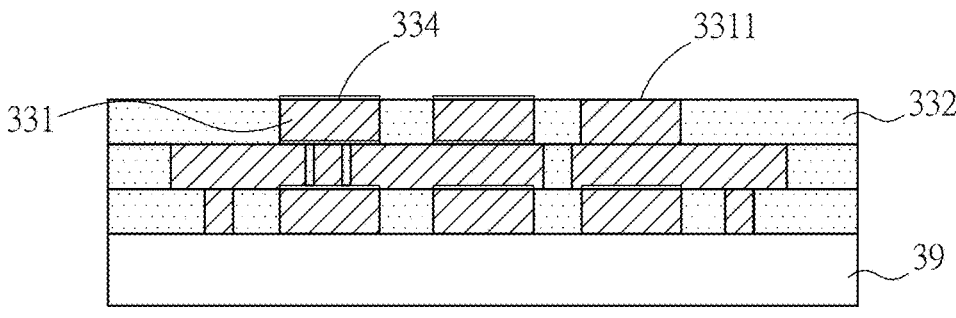

As shown in FIG. 4I, in step S10, a third patterned metal layer 331 is formed on the second semi-finished product by photolithography and electroplating. As shown in FIG. 4J, in step S11, a third dielectric layer 332 is formed on the second semi-finished product by molding to cover the third patterned metal layer 331. As shown in FIG. 4K, in step S12, a surface of the third dielectric layer 332 is polished to expose a third upper surface 3311 of the third patterned metal layer 331. As shown in FIG. 4L, in step S13, a third patterned protective layer 334 may be formed on a part of the third upper surface 3311 of the third patterned metal layer 331 exposed to the third dielectric layer 332 by photolithography and electroplating. After the manufacturing method of a hollow antenna substrate proceeds to this step, a third semi-finished product is formed.

Figure 4M:
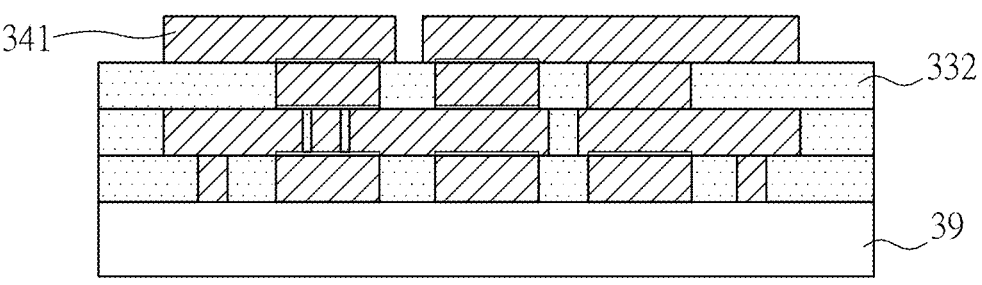
Figure 4N:
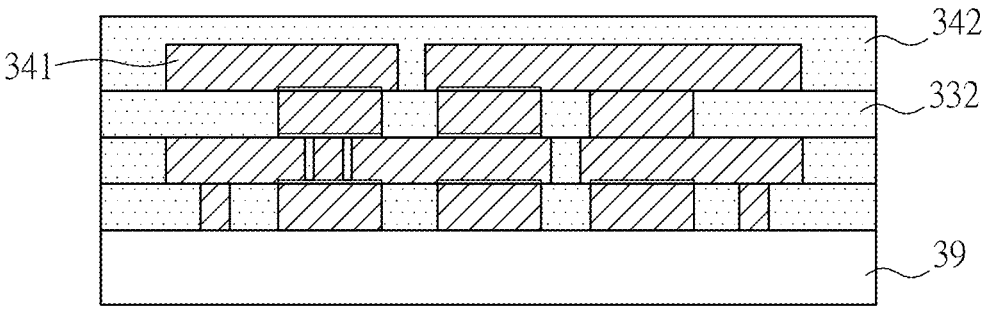
Figure 4O:
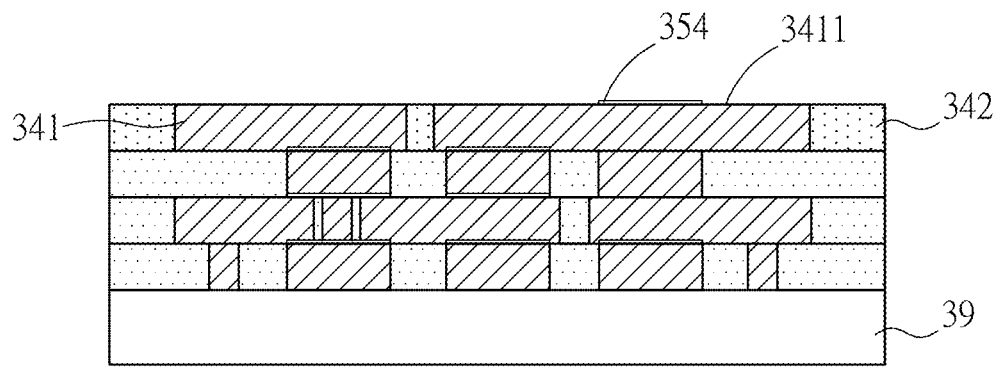

As shown in FIG. 4M, in step S14, a fourth patterned metal layer 341 is formed on the third semi-finished product by photolithography and electroplating. As shown in FIG. 4N, in step S15, a fourth dielectric layer 342 is formed on the third semi-finished product by molding to cover the fourth patterned metal layer 341. As shown in FIG. 4O, in step S16, a surface of the fourth dielectric layer 342 is polished to expose a fourth upper surface 3411 of the fourth patterned metal layer 341. Next, a fifth patterned protective layer 354 is formed on a part of the fourth upper surface 3411 of the fourth patterned metal layer 341 exposed to the fourth dielectric layer 342 by photolithography and electroplating. After the manufacturing method of a hollow antenna substrate proceeds to this step, a fourth semi-finished product is formed.

Figure 4P:
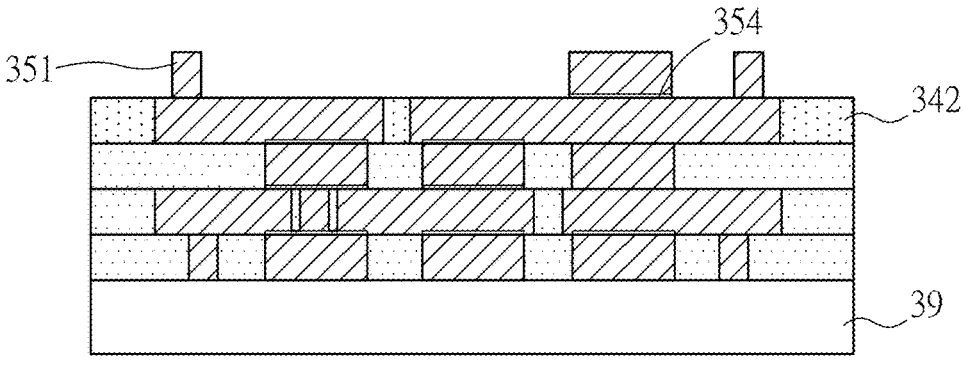
Figure 4Q:
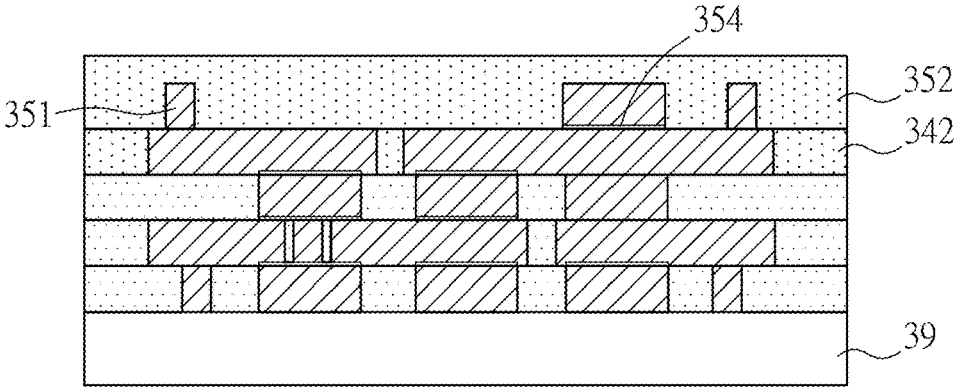
Figure 4R:
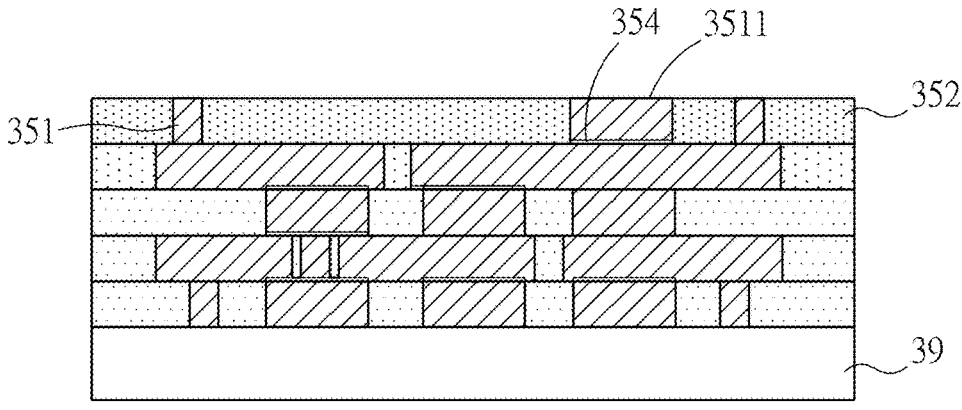
Figure 4S:
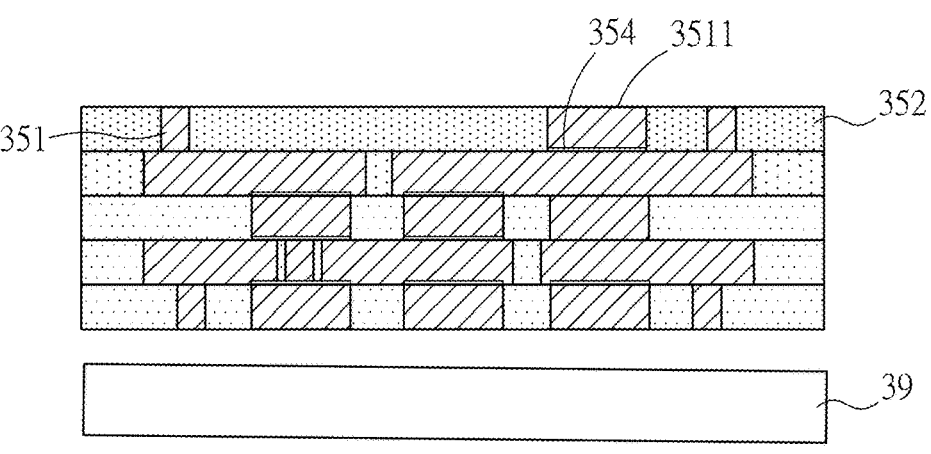
Figure 4T:
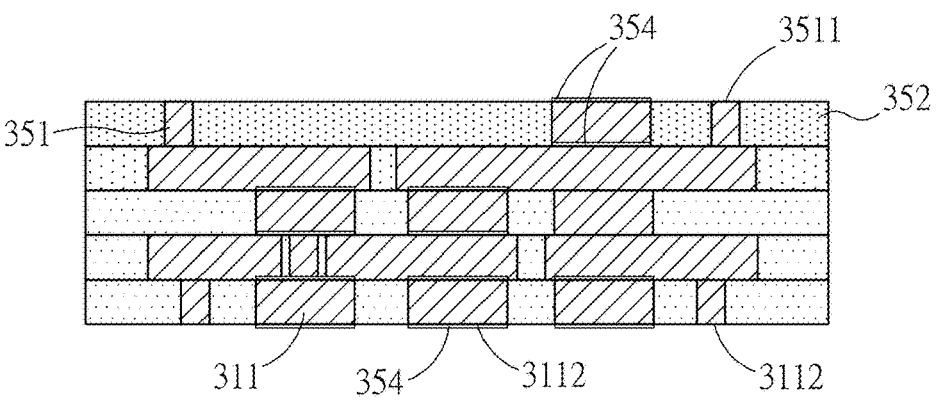
Figure 4U:
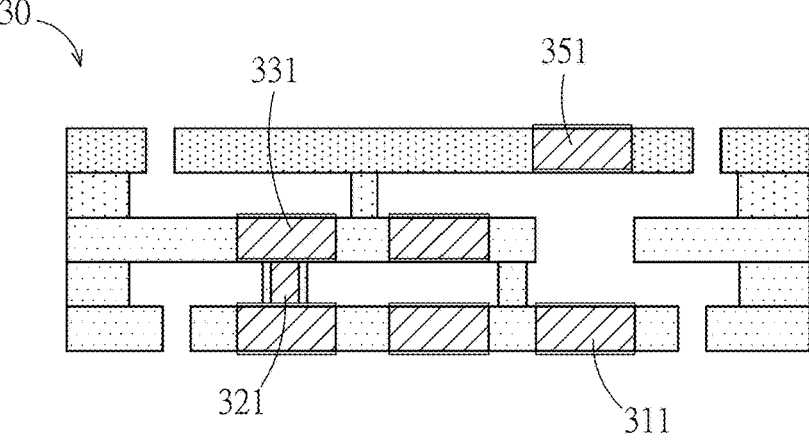

As shown in FIG. 4P, in step S17, a fifth patterned metal layer 351 is formed on the fourth semi-finished product by photolithography and electroplating. As shown in FIG. 4Q, in step S18, a fifth dielectric layer 352 is formed on the fourth semi-finished product by molding to cover the fifth patterned metal layer 351. As shown in FIG. 4R, in step S19, a surface of the fifth dielectric layer 352 is polished to expose a fifth upper surface 3511 of the fifth patterned metal layer 351. As shown in FIG. 4S, in step S20, the carrier plate 39 is removed. As shown in FIG. 4T, in step S21, a fifth patterned protective layer 354 may be formed on a part of the fifth upper surface 3511 of the fifth patterned metal layer 351 and a first lower surface 3112 of the first patterned metal layer 311 exposed to the fifth dielectric layer 352 by photolithography and electroplating. As shown in FIG. 4U, in step S22, a part of a metal material of the first patterned metal layer 311, the second patterned metal layer 321, the third patterned metal layer 331, the fourth patterned metal layer 341 and the fifth patterned metal layer 351 that are not covered and protected by the patterned protective layers is removed to form a hollow antenna substrate 30 with a hollow structure. The first patterned metal layer 311 and the third patterned metal layer 331 that partially correspond to each other, and the first patterned metal layer 311 and the fifth patterned metal layer 351 that partially correspond to each other may be electrically coupled to each other respectively to form an antenna structure.

Next, the manufacturing method of a hollow antenna substrate according to a second embodiment includes step S30 to step S64. In the second embodiment, five semi-finished products are respectively produced and then stacked to form the hollow antenna substrate. For a first semi-finished product, reference may be made to FIG. 5A to FIG. 5E. For a second semi-finished product, reference may be made to FIG. 6A to FIG. 6E. For a third semi-finished product, reference may be made to FIG. 7A to FIG. 7E. For a fourth semi-finished product, reference may be made to FIG. 8A to FIG. 8E. For a fifth semi-finished product, reference may be made to FIG. 9A to FIG. 9E.

Figure 5A:
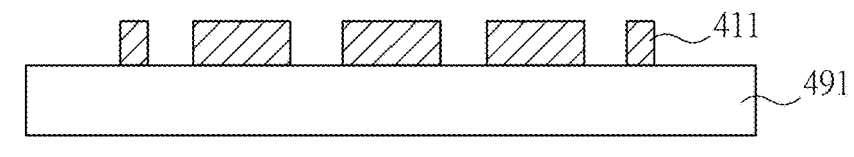
FIG. 5A to FIG. 5E are schematic structural views corresponding to a manufacturing process of a first semi-finished product in a manufacturing method of a hollow antenna substrate according to a second embodiment of the invention.
Figure 5B:
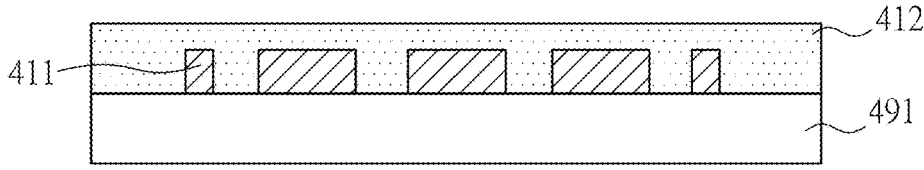
Figure 5C:
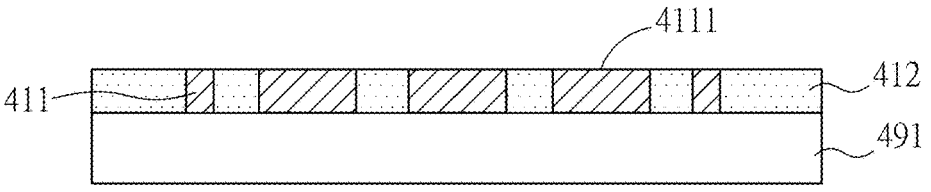
Figure 5D:
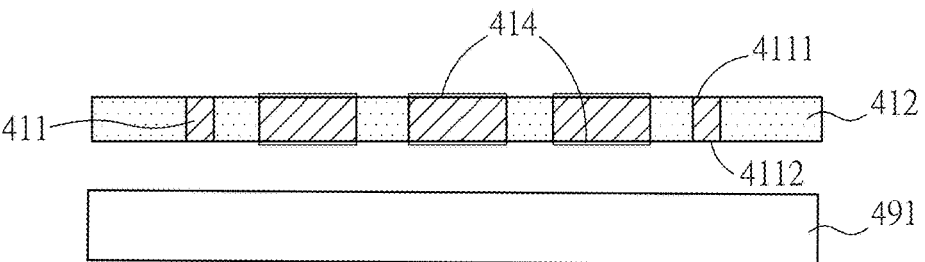
Figure 5E:
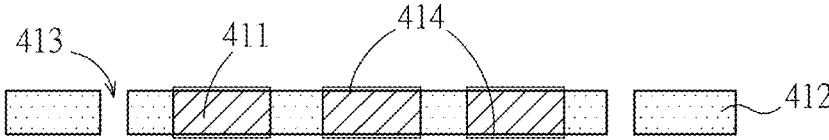

As shown in FIG. 5A, in step S30, a first carrier plate 491 is provided. In step S31, a first patterned metal layer 411 is formed on the first carrier plate 491 by photolithography and electroplating. As in the above embodiment, a material of the first patterned metal layer 411 is, for example, copper. As shown in FIG. 5B, in step S32, a first dielectric layer 412 is formed on the first carrier plate 491 by molding to cover the first patterned metal layer 411. As shown in FIG. 5C, in step S33, a surface of the first dielectric layer 412 is polished to expose a first upper surface 4111 of the first patterned metal layer 411. It is worth mentioning that while the surface of the first dielectric layer 412 is polished, the first patterned metal layer 411 is also polished. As shown in FIG. 5D, in step S34, the first carrier plate 491 is removed, and a first lower surface 4112 of the first patterned metal layer 411 is further exposed. In step S35, a first patterned protective layer 414 is formed on a part of the first upper surface 4111 and the first lower surface 4112 of the first patterned metal layer 411 exposed to the first dielectric layer 412 by photolithography and electroplating. As shown in FIG. 5E, in step S36, a metal material of the part of the first patterned metal layer 411 that is not covered and protected by the first patterned protective layer 414 is removed to form a first patterned opening 413, and a first semi-finished product is formed.

Figure 6A:
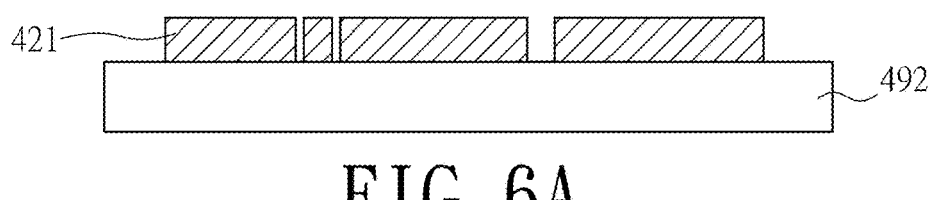
FIG. 6A to FIG. 6E are schematic structural views corresponding to a manufacturing process of a second semi-finished product in the manufacturing method of a hollow antenna substrate according to the second embodiment of the invention.
Figure 6B:
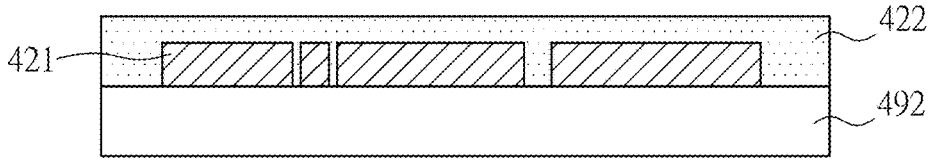
Figure 6C:
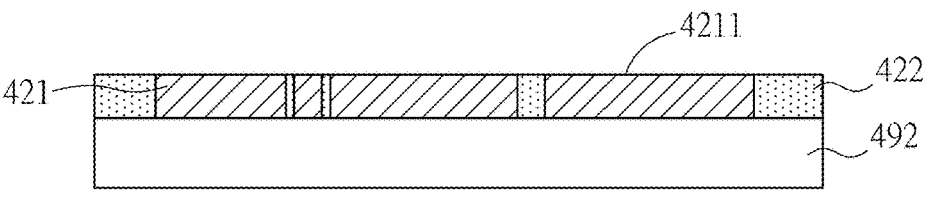
Figure 6D:
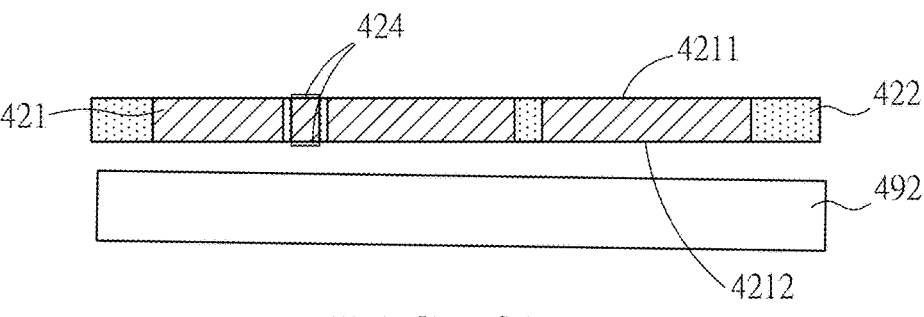
Figure 6E:
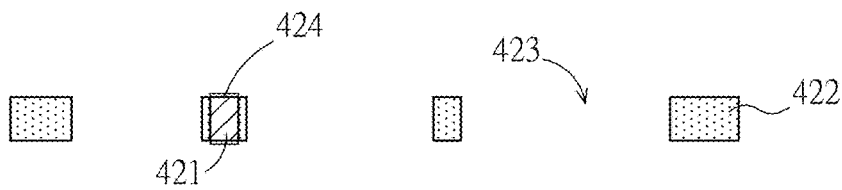

As shown in FIG. 6A, in step S37, a second carrier plate 492 is provided. In step S38, a second patterned metal layer 421 is formed on the second carrier plate 492 by photolithography and electroplating. As in the above embodiment, a material of the second patterned metal layer 421 is, for example, copper. As shown in FIG. 6B, in step S39, a second dielectric layer 422 is formed on the second carrier plate 492 by molding to cover the second patterned metal layer 421. As shown in FIG. 6C, in step S40, a surface of the second dielectric layer 422 is polished to expose a second upper surface 4211 of the second patterned metal layer 421. It is worth mentioning that while the surface of the second dielectric layer 422 is polished, the second patterned metal layer 421 is also polished. As shown in FIG. 6D, in step S41, the second carrier plate 492 is removed, and a second lower surface 4212 of the second patterned metal layer 421 is further exposed. In step S42, a second patterned protective layer 424 is formed on a part of the second upper surface 4211 and the second lower surface 4212 of the second patterned metal layer 421 exposed to the second dielectric layer 422 by photolithography and electroplating. As shown in FIG. 6E, in step S43, a metal material of the part of the second patterned metal layer 421 that is not covered and protected by the second patterned protective layer 424 is removed to form a second patterned opening 423, and a second semi-finished product is formed.

Figure 7A:
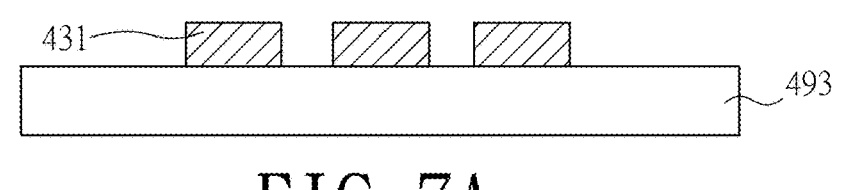
FIG. 7A to FIG. 7E are schematic structural views corresponding to a manufacturing process of a third semi-finished product in the manufacturing method of a hollow antenna substrate according to the second embodiment of the invention.
Figure 7B:
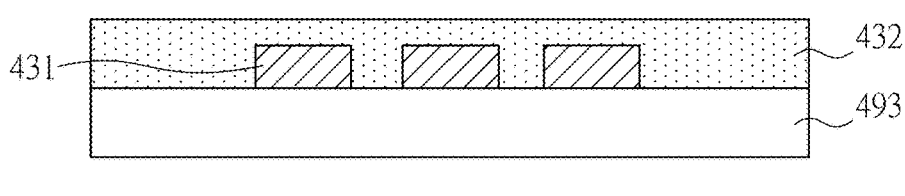
Figure 7C:
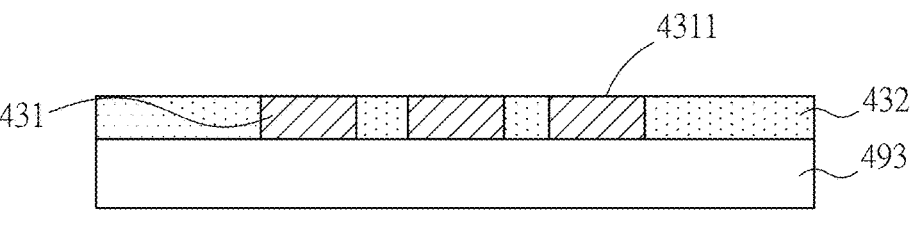
Figure 7D:
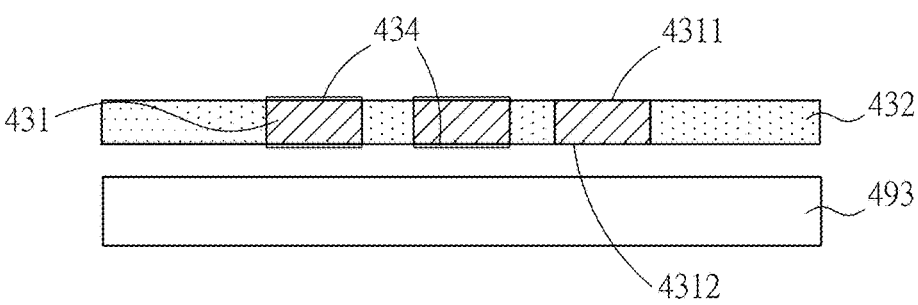
Figure 7E:
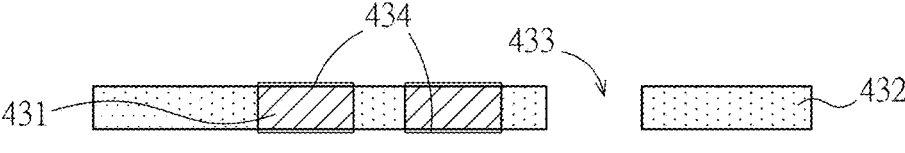

As shown in FIG. 7A, in step S44, a third carrier plate 493 is provided. In step S45, a third patterned metal layer 431 is formed on the third carrier plate 493 by photolithography and electroplating. As in the above embodiment, a material of the third patterned metal layer 431 is, for example, copper. As shown in FIG. 7B, in step S46, a third dielectric layer 432 is formed on the third carrier plate 493 by molding to cover the third patterned metal layer 431. As shown in FIG. 7C, in step S47, a surface of the third dielectric layer 432 is polished to expose a third upper surface 4311 of the third patterned metal layer 431. It is worth mentioning that while the surface of the third dielectric layer 432 is polished, the third patterned metal layer 431 is also polished. As shown in FIG. 7D, in step S48, the third carrier plate 493 is removed, and a third lower surface 4312 of the third patterned metal layer 431 is further exposed. In step S49, a third patterned protective layer 434 may be formed on a part of the third upper surface 4311 and the third lower surface 4312 of the third patterned metal layer 431 exposed to the third dielectric layer 432 by photolithography and electroplating. As shown in FIG. 7E, in step S50, a metal material of the part of the third patterned metal layer 431 that is not covered and protected by the third patterned protective layer 434 is removed to form a third patterned opening 433, and a third semi-finished product is formed.

Figure 8A:
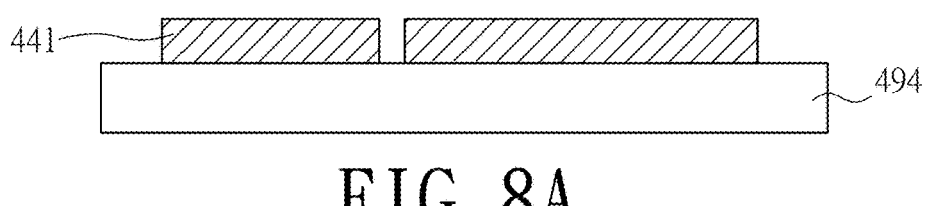
FIG. 8A to FIG. 8E are schematic structural views corresponding to a manufacturing process of a fourth semi-finished product in the manufacturing method of a hollow antenna substrate according to the second embodiment of the invention.

As shown in FIG. 8A, in step S51, a fourth carrier plate 494 is provided. In step S52, a fourth patterned metal layer

Figure 8B:
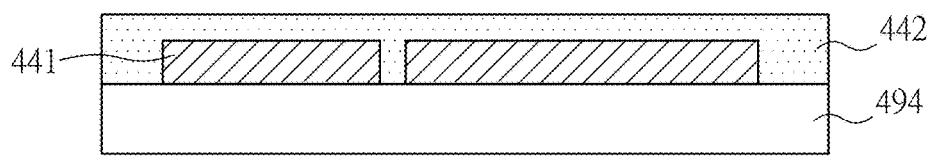
Figure 8C:
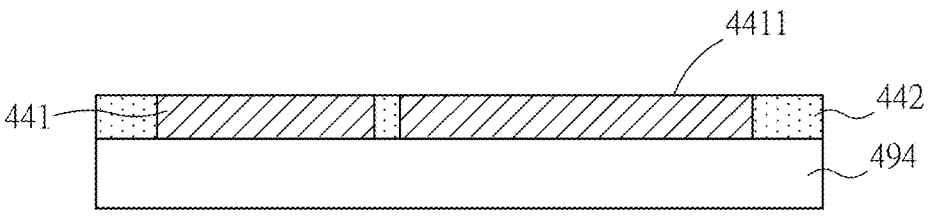
Figure 8D:
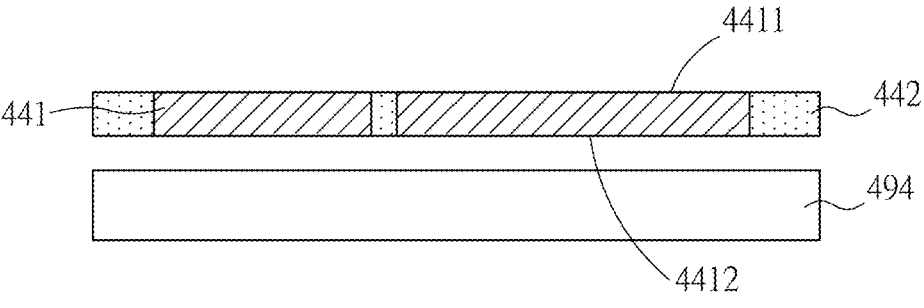
Figure 8E:

441 is formed on the fourth carrier plate 494 by photolithography and electroplating. As in the above embodiment, a material of the fourth patterned metal layer 441 is, for example, copper. As shown in FIG. 8B, in step S53, a fourth dielectric layer 442 is formed on the fourth carrier plate 494 by molding to cover the fourth patterned metal layer 441. As shown in FIG. 8C, in step S54, a surface of the fourth dielectric layer 442 is polished to expose a fourth upper surface 4411 of the fourth patterned metal layer 441, thereby forming a form in which the fourth dielectric layer 442 surrounds the fourth patterned metal layer 441. It is worth mentioning that while the surface of the fourth dielectric layer 442 is polished, the fourth patterned metal layer 441 is also polished. As shown in FIG. 8D, in step S55, the fourth carrier plate 494 is removed, and a fourth lower surface 4412 of the fourth patterned metal layer 441 is further exposed. As shown in FIG. 8E, in step S56, the fourth patterned metal layer 441 is removed to form a fourth patterned opening 443, and a fourth semi-finished product is formed.

As shown in FIG. 9A, in step S57, a fifth carrier plate 495 is provided. In step S58, a fifth patterned metal layer 451 is formed on the fifth carrier plate 495 by photolithography and electroplating. As in the above embodiment, a material of the fifth patterned metal layer 451 is, for example, copper. As shown in FIG. 9B, in step S59, a fifth dielectric layer 452 is formed on the fifth carrier plate 495 by molding to cover the fifth patterned metal layer 451. As shown in FIG. 9C, in step S60, a surface of the fifth dielectric layer 452 is polished to expose a fifth upper surface 4511 of the fifth patterned metal layer 451. It is worth mentioning that while the surface of the fifth dielectric layer 452 is polished, the fifth patterned metal layer 451 is also polished. As shown in FIG. 9D, in step S61, the fifth carrier plate 495 is removed, and a fifth lower surface 4512 of the fifth patterned metal layer 451 is further exposed. In step S62, a fifth patterned protective layer 454 is formed on a part of the fifth upper surface 4511 and the fifth lower surface 4512 of the fifth patterned metal layer 451 exposed to the fifth dielectric layer 452 by photolithography and electroplating. As shown in FIG. 9E, in step S63, a metal material of the part of the fifth patterned metal layer 451 that is not covered and protected by the fifth patterned protective layer 454 is removed to form a fifth patterned opening 453, and a fifth semi-finished product is formed.

Figure 10:
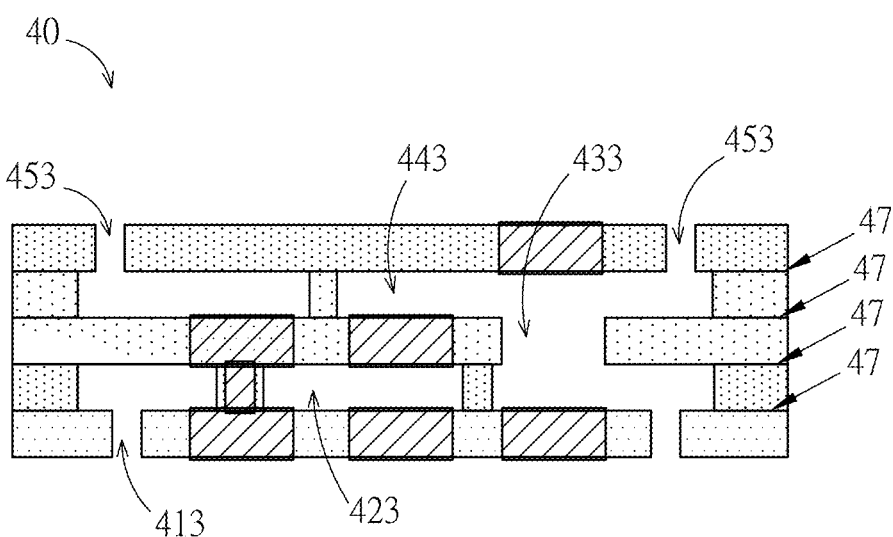
FIG. 10 is a schematic structural view of the hollow antenna substrate formed by all the semi-finished products in the manufacturing method of a hollow antenna substrate according to the second embodiment of the invention.

Finally, as shown in FIG. 10, in step S64, the first semi-finished product, the second semi-finished product, the third semi-finished product, the fourth semi-finished product and the fifth semi-finished product are stacked and bound, such that the first patterned opening 413, the second patterned opening 423, the third patterned opening 433, the fourth patterned opening 443 and the fifth patterned opening 453 form the hollow structure of the hollow antenna substrate 40. In this embodiment, the first semi-finished product, the second semi-finished product, the third semi-finished product, the fourth semi-finished product and the fifth semi-finished product are bound through a thinner adhesive 47, and the thinner adhesive 47 may be conductive or non-conductive. The conductive thinner adhesive 47 may be used to bind patterned metals, and the non-conductive thinner adhesive 47 may be used to bind dielectric materials.

Based on the above, according to the hollow antenna substrate and the manufacturing method thereof in the invention, semiconductor technology is used to form the antenna in a semiconductor package structure. The semiconductor technology, which has significantly better accuracy control in all aspects than the assembly method using the solder balls, can ensure the performance of the antenna to meet the design. Besides, since the air in the hollow structure has a dielectric constant of "1" and a loss factor of "0", it is easy to design an antenna with high performance. Moreover, the formed hollow antenna substrate can be easily bound to the semiconductor carrier, which can simplify the process of an antenna-containing carrier.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A manufacturing method of a hollow antenna substrate, comprising:

A, providing a carrier plate;

B, arranging a patterned metal layer on the carrier plate;

C, arranging a dielectric layer on the carrier plate to cover the patterned metal layer, and exposing an upper surface of the patterned metal layer;

D, arranging a patterned protective layer on a part of the upper surface of the patterned metal layer to form a substrate semi-finished product;

E, repeating step B to step D a plurality of times, wherein the carrier plate in step B is replaced with the substrate semi-finished product formed in the previous step D, and a multi-layer stacked substrate semi-finished product is formed;

F, removing the carrier plate;

G, covering a part of surfaces of the patterned metal layers on two outer sides of the multi-layer stacked substrate semi-finished product with a patterned protective layer; and H, removing a metal material of the part of the patterned metal layer that is not covered and protected by the patterned protective layer to form the hollow antenna substrate with a hollow structure.

2. A manufacturing method of a hollow antenna substrate, comprising:

A, providing a carrier plate;

B, arranging a patterned metal layer on the carrier plate, the patterned metal layer having an upper surface and a corresponding lower surface;

C, arranging a dielectric layer on the carrier plate to cover the patterned metal layer, and exposing the upper surface of the patterned metal layer;

D, removing the carrier plate, and exposing the lower surface of the patterned metal layer;

E, forming a patterned protective layer on a part of the upper surface and a part of the lower surface of the patterned metal layer;

F, removing a metal material of the patterned metal layer that is not covered by the patterned protective layer to form a semi-finished product having an opening;

G, repeating step A to step F a plurality of times to form a plurality of semi-finished products; and H, stacking and binding the plurality of semi-finished products to form the hollow antenna substrate with a hollow structure.

3. The manufacturing method of a hollow antenna substrate according to claim 2, wherein the plurality of semi-finished products are connected with each other through a thinner adhesive.

4. A hollow antenna substrate, comprising:

a first layer of the substrate, having a first patterned metal layer and a first dielectric layer, the first patterned metal layer being embedded in the first dielectric layer, and a first upper surface and a first lower surface of the first patterned metal layer being exposed to an upper surface and a lower surface of the first dielectric layer;

a second layer of the substrate, stacked on the first layer of the substrate and having a second dielectric layer, the second dielectric layer having a second patterned opening running through an upper surface and a lower surface of the second dielectric layer; and a third layer of the substrate, stacked on the second layer of the substrate and having a third patterned metal layer and a third dielectric layer, the third patterned metal layer being embedded in the third dielectric layer, and a third upper surface and a third lower surface of the third patterned metal layer being exposed to an upper surface and a lower surface of the third dielectric layer;

wherein a part of the first patterned metal layer and a corresponding overlapping part of the third patterned metal layer form an antenna unit, and are spaced apart by the second patterned opening.

5. The hollow antenna substrate of claim 4, wherein the first upper surface and the first lower surface of the first patterned metal layer, and the third upper surface and the third lower surface of the third patterned metal layer are each provided with a patterned protective layer.

6. The hollow antenna substrate of claim 4, wherein the first dielectric layer of the first layer of the substrate has a first patterned opening running through an upper surface and a lower surface of the first layer of the substrate, the third dielectric layer of the third layer of the substrate has a third patterned opening running through the upper surface and the lower surface of the third dielectric layer, and the second layer of the substrate further has a second patterned metal layer embedded in the second dielectric layer, a part of a second upper surface of the second patterned metal layer being in contact with a part of the third lower surface of the third patterned metal layer, and a part of a second lower surface of the second patterned metal layer being in contact with a part of the first upper surface of the first patterned metal layer.

7. The hollow antenna substrate according to claim 6, further comprising:

a fourth layer of the substrate, stacked on the third layer of the substrate and having a fourth dielectric layer, the fourth dielectric layer having a fourth patterned opening running through an upper surface and a lower surface of the fourth dielectric layer.

8. The hollow antenna substrate according to claim 7, further comprising:

a fifth layer of the substrate, stacked on the fourth layer of the substrate and having a fifth patterned metal layer and a fifth dielectric layer, the fifth patterned metal layer being embedded in the fifth dielectric layer, a fifth upper surface and a fifth lower surface of the fifth patterned metal layer being exposed to an upper surface and a lower surface of the fifth dielectric layer, and the fifth dielectric layer having a fifth patterned opening running through the upper surface and the lower surface of the fifth dielectric layer.

9. The hollow antenna substrate according to claim 8, wherein an overlapping part of the first patterned metal layer and the fifth patterned metal layer forms an antenna unit, and the first patterned metal layer and the fifth patterned metal layer are spaced apart by the second patterned opening, the third patterned opening and the fourth patterned opening.

10. The hollow antenna substrate according to claim 8, wherein the fifth upper surface and the fifth lower surface of the fifth patterned metal layer are each provided with a patterned protective layer.

* * * * *

5